(12) United States Patent
Chuang et al.

(10) Patent No.: US 9,070,623 B2
(45) Date of Patent: *Jun. 30, 2015

(54) CONTROLLING GATE FORMATION FOR HIGH DENSITY CELL LAYOUT

(75) Inventors: Harry-Hak-Lay Chuang, Hsinchu (TW); Bao-Ru Young, Zhubei (TW); Kuei Shun Chen, Hsin-Chu (TW); Cheng Cheng Kuo, Baoshun Township, Hsinchu County (TW); George Liu, Shin-chu (TW); Tsung-Chieh Tsai, Chu-Bei (TW); Yuhi-Jier Mii, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 298 days.

This patent is subject to a terminal disclaimer.

(21) Appl. No.: 12/897,559

(22) Filed: Oct. 4, 2010

(65) Prior Publication Data

US 2011/0042750 A1   Feb. 24, 2011

Related U.S. Application Data

(63) Continuation-in-part of application No. 12/193,538, filed on Aug. 18, 2008, now Pat. No. 8,105,929, which is a continuation of application No. 11/012,414, filed on Dec. 15, 2004, now Pat. No. 7,432,179.

(51) Int. Cl.
| | |
|---|---|
| H01L 21/338 | (2006.01) |
| H01L 21/28 | (2006.01) |
| H01L 29/66 | (2006.01) |
| H01L 21/8234 | (2006.01) |
| H01L 27/02 | (2006.01) |
| H01L 29/423 | (2006.01) |
| H01L 29/49 | (2006.01) |

(52) U.S. Cl.
CPC .... *H01L 21/28123* (2013.01); *H01L 29/66545* (2013.01); *H01L 29/66606* (2013.01); *H01L 21/823437* (2013.01); *H01L 27/0207* (2013.01); *H01L 29/4238* (2013.01); *H01L 29/4966* (2013.01)

(58) Field of Classification Search
USPC ............. 438/183; 257/270, 331, 363, E21.44
See application file for complete search history.

(56) References Cited

U.S. PATENT DOCUMENTS

| 5,598,010 | A * | 1/1997 | Uematsu .......................... 257/48 |
|---|---|---|---|
| 6,194,252 | B1 * | 2/2001 | Yamaguchi .................... 438/129 |
| 6,287,904 | B1 * | 9/2001 | Lee et al. ....................... 438/197 |
| 7,432,179 | B2 * | 10/2008 | Chuang et al. ................. 438/551 |
| 8,105,929 | B2 * | 1/2012 | Chuang et al. ................. 438/551 |
| 2003/0192012 | A1 * | 10/2003 | Liu ..................................... 716/2 |
| 2004/0209411 | A1 * | 10/2004 | Fisher et al. ................... 438/197 |
| 2005/0076320 | A1 * | 4/2005 | Maeda ............................ 716/10 |
| 2008/0305599 | A1 | 12/2008 | Chuang et al. |

* cited by examiner

*Primary Examiner* — Su C Kim
(74) *Attorney, Agent, or Firm* — Haynes and Boone, LLP

(57) ABSTRACT

Methods of forming a semiconductor structure and the semiconductor structure are disclosed. In one embodiment, a method includes forming a gate dielectric layer over a substrate, forming a gate electrode layer over the gate dielectric layer, and etching the gate electrode layer and the gate dielectric layer to form a horizontal gate structure and a vertical gate structure, wherein the horizontal gate structure and the vertical gate structure are connected by an interconnection portion. The method further includes forming a photoresist covering the horizontal gate structure and the vertical gate structure, with the photoresist having a gap exposing the interconnection portion between the horizontal gate structure and the vertical gate structure, and then etching the interconnection portion.

18 Claims, 14 Drawing Sheets

CONTROLLING GATE FORMATION FOR HIGH DENSITY CELL LAYOUT

CROSS-REFERENCE TO RELATED APPLICATIONS

This application is a continuation-in-part of U.S. patent application Ser. No. 12/193,538 filed Aug. 18, 2008 and entitled "Gate Control and Endcap Improvement", which is a continuation of U.S. application Ser. No. 11/012,414 filed on Dec. 15, 2004, now U.S. Pat. No. 7,432,179, and entitled "Controlling Gate Formation By Removing dummy Gate Structures", the disclosures of which are incorporated herein by reference in their entirety and for all purposes

BACKGROUND

This invention relates to semiconductor devices, specifically to the gate critical dimension control and endcap improvement through use of dummy patterns.

The existence of pattern effect in films has been well known. There is a problem that a "micro-loading effect" occurs due to a difference in pattern density and degrades the uniformity of pattern sizes. The micro-loading effect pertains to a phenomenon occurring upon simultaneously etching or polishing a pattern of a higher density and a pattern of a lower density. Due to a difference in the etching/polishing rate of a film from one location to another, the amount of reaction produced by the etching/polishing becomes locally dense or sparse, and the convection of a large amount of reaction products by etching with a low volatility causes a non-uniformity in the etching rate. Large variations in effective pattern density have been shown to result in significant and undesirable effects such as pattern dimension deviation and thickness variation.

To counteract this effect, a layout design step known as dummy fill, where the circuit layout is modified and dummy patterns are added to locations with low pattern density, was developed. The adding of dummy patterns helps to achieve uniform effective pattern density across the wafer, therefore avoiding problems.

Conventionally, such dummy patterns are left in place. In the case dummy patterns are conductive, they form parasitic capacitance with the interlayer metal wiring. The parasitic capacitance contributes to the RC time delay due to charging and discharging time. The scaling scheme of interlayer dielectrics (ILD) and higher operation frequency for advanced processes will cause severe performance degradation due to unwanted parasitic capacitance. At the present stage of development of the integrated circuit art, there is an increasing demand in the field of digital integrated circuits for faster switching circuits. As the switching demands of the integrated circuits go into higher frequency, the slowing effect produced by parasitic capacitance becomes an increasing problem.

Since dummy patterns are not removed, they cannot be formed in an active region, or oxide defined (OD) region. Leftover dummy patterns not only increase parasitic capacitance and degrade device performance, but also affect the subsequent processes. One of the conventional solutions is to place dummy patterns surrounding, but not in, the active regions. Not being able to be placed in desired regions, the effect of the dummy patterns is significantly limited. Such an arrangement also increases the difficulty of fine-tuning the dummy patterns. There were also efforts made to put dummy patterns into dummy active regions, or regions having neither an oxide nor an active device. However, the results have generally not proven satisfactory.

There is another effect that also affects the semiconductor process. When two devices are too close to each other, "optical proximity effects" occur. Optical proximity effects are due to light diffraction and interference between closely spaced features on the reticle resulting in the widths of lines in the lithographic image being affected by other nearby features. One component of the proximity effect is optical interaction among neighboring features; other components arise from similar mechanisms in the resist and etch processes. Thus, under the present restricted design rule (RDR) environment, when a special layout design of polysilicon ("poly") gates includes poly gates disposed in vertical and horizontal directions (from a top view perspective), an area penalty is needed to avoid undesirable side effects in lithography, process, and device. For example, as shown in FIGS. 15 and 17, the minimum spacing between the tip of a vertical poly line endcap 87 and an adjacent horizontal poly line 80c has typically been a minimum of about 100 nm for lithography to be used to form a satisfactory poly line. In another example, as further shown in FIGS. 15 and 17, a poly endcap 87 has been required to extend a minimum of 80 nm to also avoid optical proximity effects.

The micro-loading and proximity effects affect the gate formation of metal-oxide-semiconductor (MOS) devices. The critical dimension, or the gate length of a MOS device, may deviate significantly from design. For example, if an 80 nm gate length is desired, when the critical dimension of a MOS device in a dense device area is on target at 80 nm, the critical dimension of a MOS device in an isolated device area may reach around 110 nm, or 30 nm more than the target value in certain cases. Also the deviations for nMOS and pMOS gates are different, causing N/P ratio mismatching and complicating circuit design. Furthermore, the spacing limitations for vertical and horizontal poly lines mentioned above make improving total gate density difficult.

Lack of process control in gate formation also causes endcap problems. FIG. 1 illustrates a conventional layout comprising two MOS devices. Gate 2 and active region 6 form a first device 8. Gate 4 and active region 7 form a second device 5. Gates 2 and 4 have endcaps 9 and 11 respectively, extending outside active regions 6 and 7. Due to the micro loading or proximity effects, endcaps 9 and 11 may be longer or shorter than designed. When endcaps 9 and 11 are longer than designed, polysilicon ("poly") gates 2 and 4 may be shorted, causing device failure. Conversely, problems may also occur if endcaps 9 and 11 are shorter than designed, as shown in FIG. 2. If endcap 9 or 11 is recessed into the active region 6 or 7, it cannot effectively control the channel of the device and shut off the MOS device. As a consequence, a significant leakage current may exist between the source and drain of devices 8 and 5.

SUMMARY

The present disclosure provides for many different embodiments. One of the broader forms of the present disclosure involves a method of fabricating a semiconductor device. The method includes forming a gate dielectric layer over a substrate, forming a gate electrode layer over the gate dielectric layer, and etching the gate electrode layer and the gate dielectric layer to form a horizontal gate structure and a vertical gate structure, wherein the horizontal gate structure and the vertical gate structure are connected by an interconnection portion. The method further includes forming a photoresist covering the horizontal gate structure and the vertical gate structure, with the photoresist having a gap exposing the interconnection portion between the horizontal gate structure and the vertical gate structure, and then etching the interconnection portion.

Another of the broader forms of the present disclosure involves another method of fabricating a semiconductor device. The method includes providing a semiconductor substrate comprising: a first active region; a second active region; and an insulating region separating the first and the second active regions. The method further includes forming a vertical gate structure extending over the first and the second active regions and the insulating region, and forming a horizontal gate structure extending over the insulating region between the first and the second active regions, wherein the horizontal gate structure and the vertical gate structure are connected by an interconnection portion. A photoresist having a first portion and a second portion is then formed, wherein the first portion of the photoresist covers a portion of the vertical gate structure, and the second portion of the photoresist covers the horizontal gate structure, wherein the first and the second portions of the photoresist have a gap exposing the interconnection portion directly over the insulating region. The interconnection portion is then etched.

Another of the broader forms of the present disclosure involves a semiconductor structure. The semiconductor structure includes a substrate having a first active region, a second active region, and an insulating region separating the first and the second active regions. The structure further includes a vertical gate structure extending over the first and the second active regions and the insulating region, and a horizontal gate structure extending over the insulating region between the first and the second active regions, wherein the horizontal gate structure and the vertical gate structure have a gap of about 80 nm therebetween directly over the insulating region.

By using embodiments of the present invention, the critical dimensions of the MOS devices are controlled. Bridging and line end shortening are avoided. Due to more accurate device dimensions with respect to design, N/P ratios are more controllable without the need for complicated fine tune techniques such as optical proximity correction (OPC). Therefore, the overall chip speed and performance are improved. Also, the spacing limitations of adjacent vertical and horizontal polysilicon lines are reduced and the total gate density may be improved.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, although the present disclosure provides examples of a damascene process and a "gate last" metal gate process, one skilled in the art may recognize applicability to other processes and/or use of other materials.

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

For the embodiments illustrated in FIGS. 3 through 12, like reference numbers may designate like elements throughout the various views and illustrative embodiments. Each figure number may be followed by a letter A or B, where A indicates that the figure is a cross sectional view and B indicates a corresponding top view of the figure whose numbers have an "A" as suffix.

Figure 3:
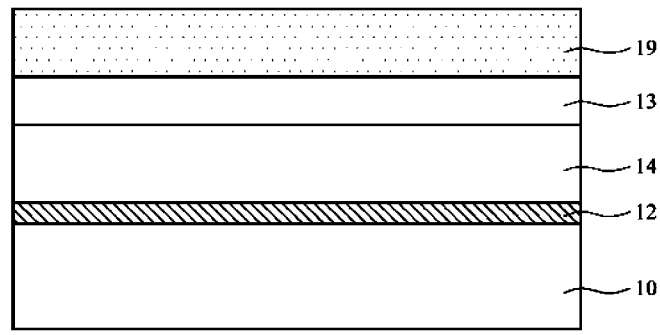
FIGS. 3 through 9 are cross-sectional views and top views of intermediate stages in the manufacture of a MOS transistor embodiment.

FIGS. 3 through 9 are cross-sectional views and top views of intermediate stages in the manufacture of a gate structure of a MOS transistor embodiment. FIG. 3 illustrates stack layers formed on a substrate 10. Substrate 10 comprises active regions on which MOS devices can be formed. Typically, the boundaries of active regions are defined by oxides such as shallow trench isolations. Depending on where an active region is located, a non-oxide region may be referred as either an active region, which has active devices formed therein, or a dummy active region, which has no active devices formed therein. A gate dielectric layer 12 is formed over the substrate 10. Gate dielectric layer 12 may be formed of thermal oxidation or other methods. Gate dielectric layer 12 may be comprised of $SiO_2$, oxynitride, nitride, and/or high-k materials. A gate electrode layer 14 is formed on the gate dielectric layer 12. In one example, gate electrode 14 is comprised of polysilicon, although it may also be metal or metal compound comprising titanium, tungsten, cobalt, aluminum, nickel or combinations thereof. For the case gate electrode 14 is comprised of polysilicon, silane ($SiH_4$), di-silane ($Si_2H_6$), or di-chlorosilane ($SiCl_2H_4$) may be used as a chemical gas in a CVD process to form the poly layer in one example. Alternatively, an amorphous silicon layer may optionally be formed instead of the polysilicon layer.

Substrate 10 may be comprised of silicon material or alternatively may include silicon germanium, gallium arsenic, or other suitable semiconductor materials. The substrate 10 may further include doped regions such as a P-well and/or an N-well (not shown). The substrate 10 may also include other features such as a buried layer, and/or an epitaxy layer. Furthermore, the substrate 10 may be a semiconductor on insulator such as silicon on insulator (SOI). In other embodiments, the semiconductor substrate 10 may include a doped epitaxy layer, a gradient semiconductor layer, and/or may further include a semiconductor layer overlying another semiconductor layer of a different type, such as a silicon layer on a silicon germanium layer. In other examples, a compound semiconductor substrate may include a multilayer silicon structure or a silicon substrate may include a multilayer compound semiconductor structure. The active region may be configured as an NMOS device (e.g., nFET) or a PMOS device (e.g., pFET) in one example.

Figure 4:
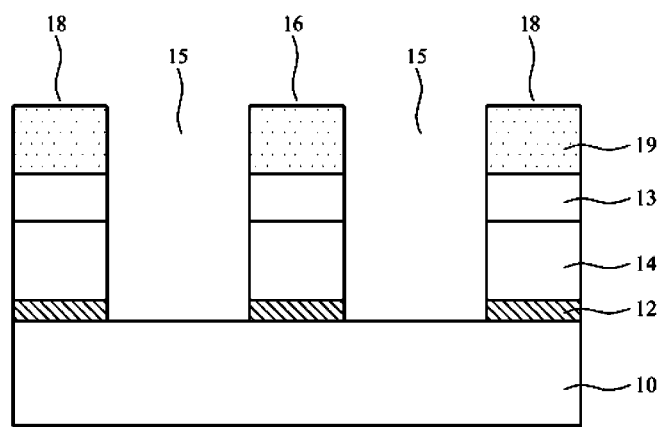

FIG. 3 also illustrates a photoresist 19 formed over the electrode 14. Since the gate dimensions are critical, an anti-reflective coating (ARC) 13 may be formed. FIG. 4 illustrates a bottom anti-reflective coating (BARC) 13 that is formed under the photoresist 19. In alternative embodiments, a top anti-reflective coating (TARC) may also be formed on top of the photoresist 19. ARC 13 absorbs light and provides ultimate critical dimension control. The material of the BARC 13 depends on the material of the photoresist 19 and may be organic materials or in-organic materials, such as $SiO_xN_y$ and SiN formed of low-pressure chemical vapor deposition (LPCVD) or plasma-enhanced chemical vapor deposition (PECVD), and oxide. A person skilled in the art will recognize the right combination of the photoresist 19 and suitable ARC 13 materials. BARC 13 can be applied using a spin-on technique or by deposit in a gas chamber in one example.

FIG. 4 illustrates formation of gate structure 16 and dummy patterns 18. Openings 15 are formed in photoresist 19 and BARC 13. The process suitable for forming such openings depends on the materials of the photoresist 19 and BARC 13. In this embodiment, BARC 13 is organic and developer soluble, thus photoresist 19 and BARC 13 can be exposed and developed in one process. In other embodiments, either BARC 13 is inorganic or developer insoluble, and a two-step process is performed. The photoresist 19 is exposed and developed first, and BARC 13 is then removed from the openings in the photoresist 19 and thus openings 15 are formed. Exposed gate electrode layer 14 and dielectric layer 12 are then etched through the openings 15, forming gate stack 16 and dummy patterns 18. Both gate 16 and dummy patterns 18 include a gate oxide layer 12, a gate electrode 14 and a BARC 13. The method of etching gate electrode layer 14 and dielectric layer 12 is well known in the art.

Figure 5A:
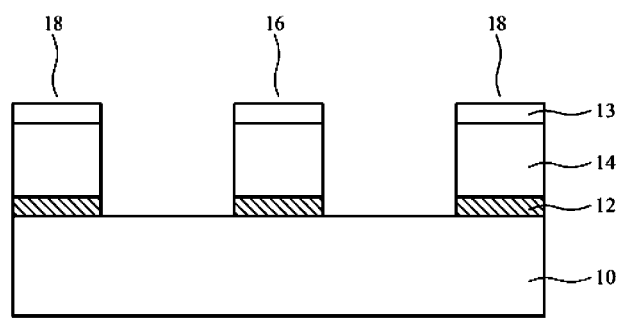
Figure 5B:
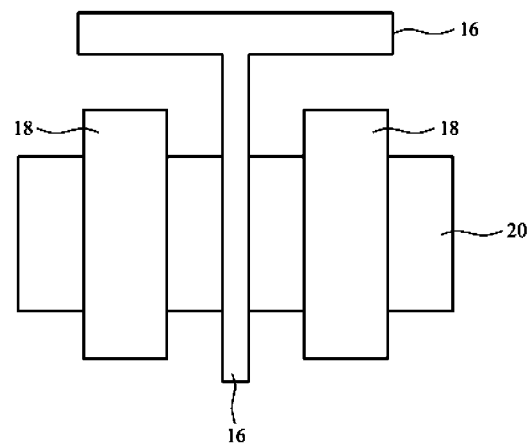

Photoresist 19 is then stripped or etched, forming a structure shown in FIG. 5A. FIG. 5B illustrates a top view of the structure in FIG. 5A. At least one of the dummy patterns 18 has a portion formed on the active region 20. Since the dummy patterns 18 can be formed in the active region, it is significantly easier to arrange the dummy patterns so that the effective device density is substantially uniform throughout a chip. The results have shown that the micro-loading effect is effectively reduced by the embodiment. Typically, in the after development inspection, the deviation of the critical dimension is less than about 2 nm, which means when the target critical dimension is 80 nm, the resulting critical dimension is between about 78 nm to about 82 nm.

For clarity, only two dummy patterns 18 are shown in FIG. 5B. In an actual design, the number of dummy patterns and the spacing between dummy patterns will change and can be generated and fine tuned by a dummy utility system. Since nMOS and pMOS devices react differently to micro-loading effects, the spacing between the dummy patterns in an nMOS region and a pMOS region can be different. Non-uniform spacing can further increase the accuracy of the critical dimension and lower the deviations.

The embodiment discussed above illustrates one of the methods for forming gate structures. Other methods may also be used in alternative embodiments. If lithography, etching, or CMP are involved, micro-loading effects occur and dummy patterns are formed. In one embodiment, dummy patterns are formed of the same material as the gate electrode.

Figure 6A:
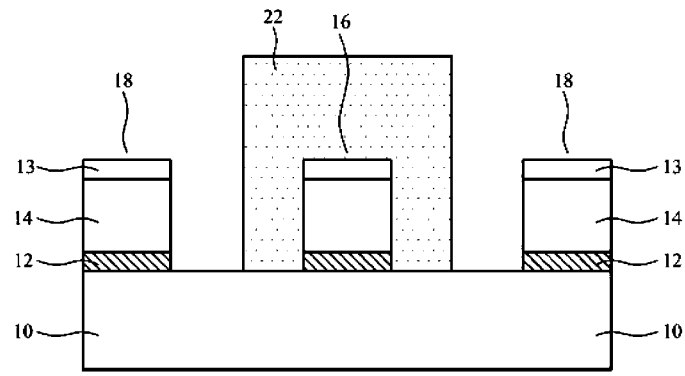
Figure 6B:
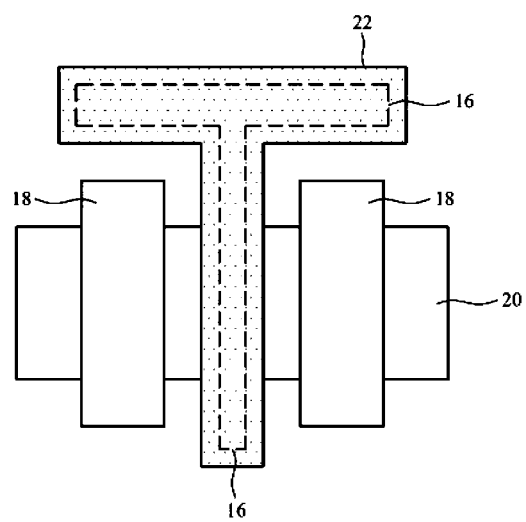

Dummy patterns 18 are then removed since they affect the subsequent processes and otherwise may cause device performance degradation. FIG. 6A illustrates a photoresist 22 formed covering the gate structure 16. In some cases, it may be desired that photoresist 22 extends beyond gate structure 16 for between about 10 nm and about 150 nm so that it is guaranteed that the gate structure 16 is completely covered. The purpose of the photoresist 22 is to protect the gate structure when dummy patterns 18 are removed. Therefore the dimension and alignment of photoresist 22 are not critical as long as it protects gate structure 16 without covering dummy patterns 18. FIG. 6B illustrates a top view of the structure illustrated in FIG. 6A. As shown, gate structure 16 is covered completely and dummy patterns 18 are left uncovered.

Dummy patterns 18 are then etched. Since the gate structure 16 is completely protected by photoresist 22, it is not etched and the dimensions created in the previous forming steps are preserved.

Figure 7A:
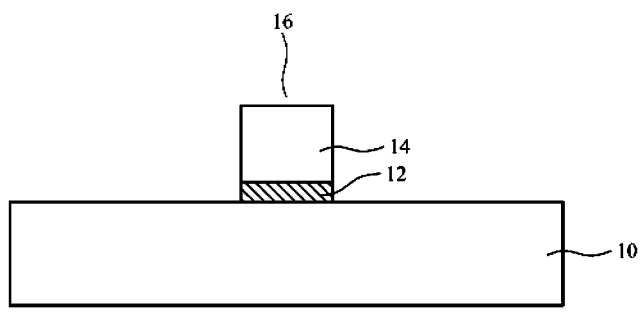
Figure 7B:
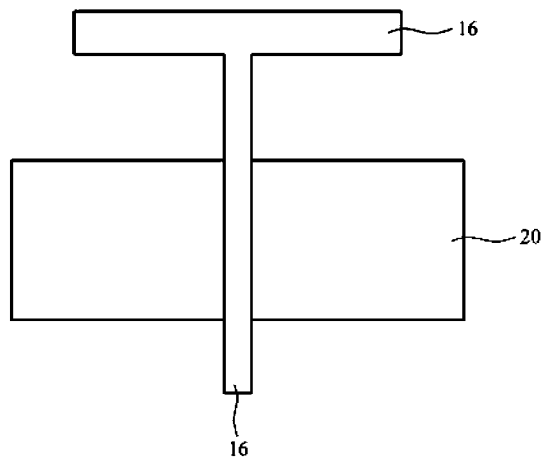
Figure 8:
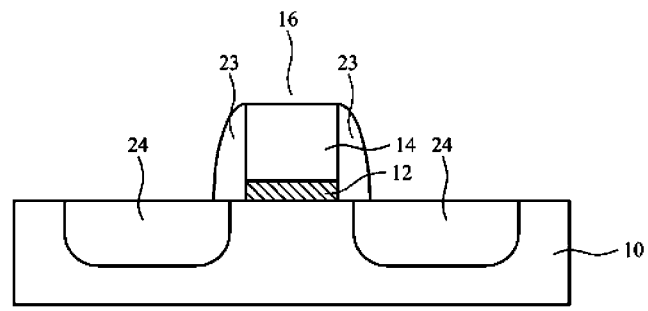

FIG. 7A illustrates the gate structure after the photoresist 22 is removed. FIG. 7B illustrates a top view of FIG. 7A. The BARC layer 13 is stripped after the device gate pattern is formed. Remaining elements of the MOS devices such as gate spacers, source and drain, etc. are formed using known methods, as shown in FIG. 8. A pair of spacers 23 is formed along the sidewalls of the gate dielectric 12 and gate electrode 14. Spacers 23 serve as self-aligning masks for subsequent source/drain formation steps, as described below. The spacers 23 may be formed by well-known methods such as blanket or selectively depositing a dielectric layer over regions including substrate 10 and gate structure 16, then anisotropically etching to remove the dielectric from the horizontal surfaces and leaving spacers 23. In this embodiment, doping of the regions of substrate 10 on the side of spacers 23 may be performed to form part or the entire transistor source and drain regions 24. In other embodiments, other methods of forming source and drain regions 24 may be used.

Figure 9:
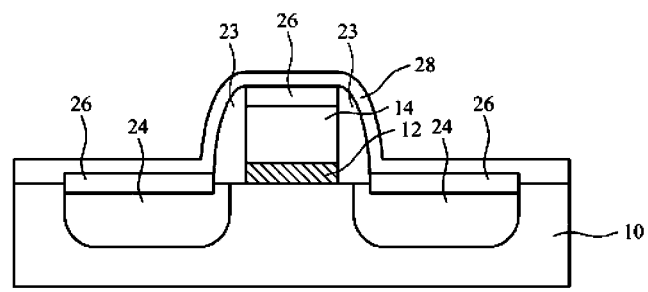

FIG. 9 illustrates formation of a silicide 26 and an etch stop layer (ESL) 28. Silicide 26 is formed over source and drain regions 24 and in one embodiment over gate electrode 14 as well. In one embodiment, silicide 26 is a metal silicide formed by first depositing a thin layer of metal, such as titanium, cobalt, nickel, tungsten, or the like, over the device, including the exposed surfaces of source and drain regions 24 and gate electrode 14. The device is then heated, which causes the silicide reaction to occur wherever the metal is in contact with the silicon. After reaction, a layer of metal nitride is formed between silicide and metal. The un-reacted metal is selectively removed through the use of an etchant that does not attack the silicide, $SiO_2$ and silicon substrate.

An etch stop layer (ESL) 28 is next blanket deposited over the device. ESL 28 may be formed using low-pressure chemical vapor deposition (LPCVD), but other CVD methods, such as plasma enhanced chemical vapor deposition (PECVD), and thermal CVD may also be used.

Figure 1:
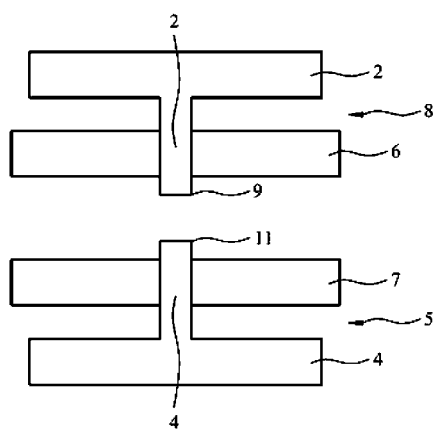
FIG. 1 illustrates a top view of a conventional semiconductor structure having endcaps of MOS devices next to each other.
Figure 2:
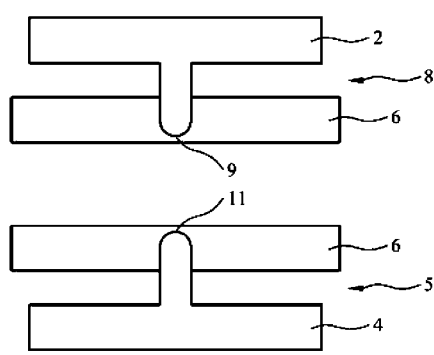
FIG. 2 illustrates a top view of a conventional semiconductor structure having endcaps of MOS devices next to each other, the endcaps are recessed into the active regions.
Figure 10:
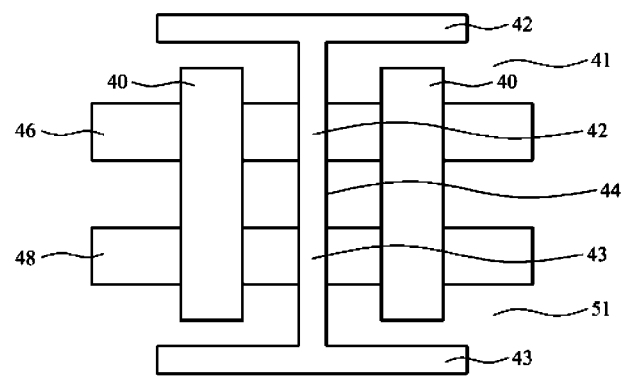
FIGS. 10 through 12 are top views of intermediate stages in the manufacture of another MOS transistor embodiment, wherein endcaps of two MOS devices are next to each other.
Figure 11:
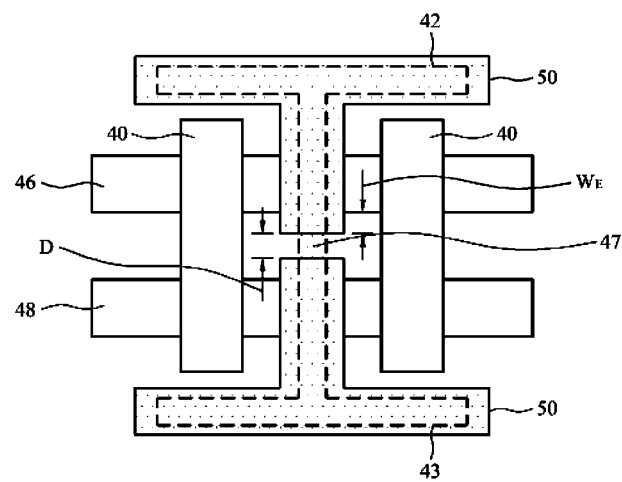
Figure 12:
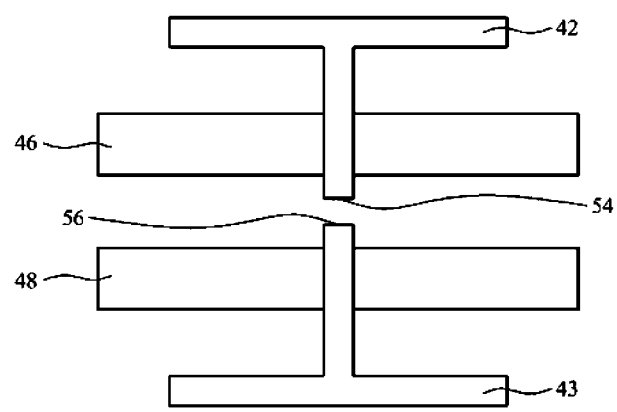

FIGS. 10 through 12 illustrate another embodiment of the present invention. In some situations that the gate endcaps of two devices are closely located, as shown in FIG. 1, problems such as bridging and poly line end shortening may occur, causing device failure or degradation. Therefore, gate endcap dimensions need to be controlled carefully. As noted previously, prior gate endcaps were required to extend a minimum of 80 nm to avoid optical proximity effects.

FIG. 10 illustrates a top view of this embodiment after the gate structures 42 and 43 and dummy patterns 40 are formed. The method for forming gates 42 and 43 and dummy patterns 40 has been described with reference to FIGS. 3 through 5 and will not be repeated in the present embodiment. A gate structure 42 for MOS device 41 is formed with at least a portion on a first active region 46. A gate structure 43 for MOS device 51 is formed with at least a portion on a second active region 48. The first and second active regions may actually be one active region or separated regions. Gate structures 42 and 43 are interconnected at point 44. As has been discussed, the introduction of dummy patterns into active regions improves the process so that the critical dimensions of the gates 42 and 43 are more closely on target. MOS devices 41 and 51 can be an nMOS-pMOS pair, two nMOS or two pMOS, or other combinations. Since dummy patterns 40 can be formed in active regions 46 and 48, device densities are more uniform and the deviation of the critical dimensions of gates 42 and 43 is controlled better.

FIG. 11 illustrates a photoresist 50 formed protecting the gate structures 42 and 43. Similar to the previously discussed embodiment, it may be desirable that photoresist 50 extends beyond gates 42 and 43 for between about 10 nm and about 150 nm so that it is guaranteed that the gates 42 and 43 are completely covered. A gap 47 is formed between the photoresist covering gates 42 and 43. In one embodiment, gap 47 has a width D of greater than about 50 nm, and in yet another embodiment between about 50 nm and about 500 nm, although the width D is a design consideration and can be changed according to the layout. In order to prevent over-etching through the gap 47 in the subsequent process steps causing gate ends recessing back into active regions 46 and 48, it may be desired that the photoresist 50 extends beyond active regions 46 and 48 for a distance $W_E$ of more than about 50 nm, and in another embodiment, more than about 200 nm.

Dummy patterns 40 are then etched and photoresist 50 is removed. The resulting structure after the photoresist 50 is removed is illustrated in FIG. 12. The connecting portion unprotected by the photoresist 50 is also etched and gates 42 and 43 are disconnected. By using this embodiment of the present invention, the endcaps 54 and 56 are controlled so that no bridging or end shortening occurs due to lithography and etching.

The remaining elements of the MOS device such as spacers, source/drain, etc, are then formed. The forming process has been discussed in previous embodiments and thus will not be repeated.

By using embodiments of the present invention, the critical dimensions of the MOS devices are controlled. Typically, in an 80 nm critical dimension device, the deviation of the critical dimension is less than about 2 nm. Bridging and line end shortening are avoided. Due to more accurate dimension control with respect to design, N/P ratios are more controllable without using complicated fine tune techniques such as OPC and LPE. The overall chip speed and performance are improved. Although the embodiments of the present invention only discusses the process of normal MOS devices, other MOS devices such as double gate transistors and lateral diffusion MOS can also benefit.

Figure 13A:
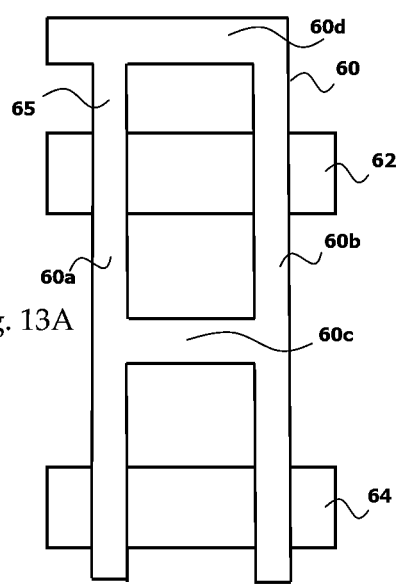
FIGS. 13A-13C illustrate top views of intermediate stages in the manufacture of a semiconductor structure.
Figure 13B:
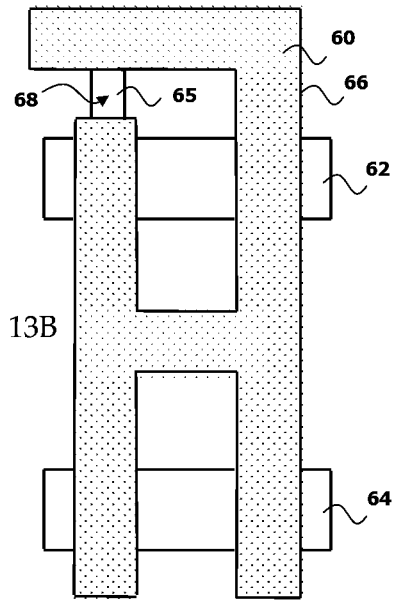
Figure 13C:
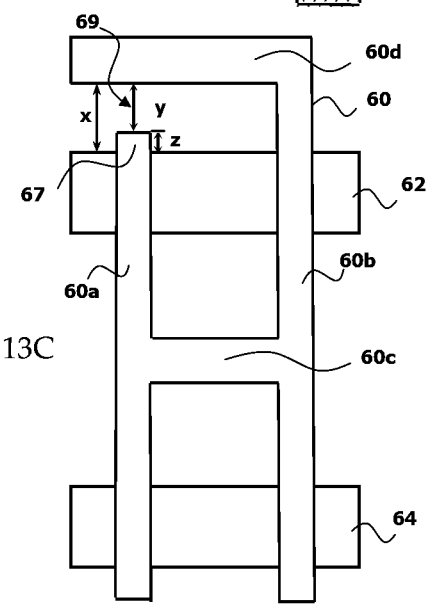

Referring now to FIGS. 13A-13C, top views are illustrated of intermediate stages in the manufacture of a semiconductor structure having vertical and horizontal gate structures in a high density layout. FIG. 13A illustrates a top view of a gate structure 60 including vertical gate structures 60a and 60b and horizontal gate structures 60c and 60d. Portions of vertical gate structures 60a and 60b are formed over active regions 62 and 64. Horizontal gate structures 60c and 60d are formed over insulating regions. Dummy patterns (not shown) may also be formed in active and insulating regions. The dummy patterns may have uniform or non-uniform spacing and may be comprised of the same material as the gate structures. An example method for forming gate structure 60 and dummy patterns has been described above with reference to FIGS. 3 through 5 and will not be repeated in the present embodiment. However, various layer deposition, photolithography, and etch techniques may be used to form gate structure 60. As will be noticed, vertical gate structures 60a, 60b and horizontal gate structures 60c, 60d form several sections of an "H" shaped gate structure 60 with an overbar 60d. It will be further noticed that vertical gate structures 60a, 60b and horizontal gate structures 60c, 60d can form several "T" and "L" shaped parts of the gate structure 60. For example, in this embodiment, horizontal gate structure 60d and vertical gate structure 60a form a "T" shaped part of gate structure 60. The horizontal gate structure 60d and vertical gate structure 60a are interconnected by an interconnection portion 65, which will be later etched as further described below. An example of an "L" shaped part of gate structure 60 is formed by horizontal gate structure 60d and vertical gate structure 60b. Although the interconnection portion 65 is described in this embodiment, gate structure 60 may be considered to have an interconnection portion at any section between a horizontal gate structure and a vertical gate structure which is desired to be etched.

FIG. 13B illustrates a photoresist 66 formed over gate structure 60 protecting the vertical and horizontal gate structures but exposing the interconnection portion 65 through a photoresist gap 68 in the photoresist 66. Similar to the previously discussed embodiment, photoresist 66 may extend beyond parts of gate structure 60 for between about 10 nm and about 150 nm so that parts of the gate structure are completely covered. Gap 68 is formed in the photoresist 66 over the interconnection portion 65. In one embodiment, gap 68 has a width "y" between about 65 nm and about 95 nm (as shown by a gate gap 69 in gate structure 60 in FIG. 13C), although the width y of photoresist gap 68 is a design consideration and can be changed according to the layout. Thus, in one aspect, the width y between a horizontal gate structure and a vertical gate structure end is between about 65 nm and about 95 nm, and in another aspect width y is greater than about 80 nm and less than 100 nm. In order to prevent over-etching through the photoresist gap 68 in the subsequent process steps causing gate ends to recess back into active region 62, photoresist 66 extends beyond active region 62 for a distance between about 40 nm and about 60 nm in one aspect (as shown by endcap 67 in FIG. 13C). The patterned photoresist 66 may be formed by photolithography, immersion lithography, ion-beam writing, or other suitable techniques. For example, the photolithography process may include spin-coating, soft-baking, exposure, post-baking, developing, rinsing, drying, and other suitable processes.

Dummy patterns are then etched and photoresist 66 is removed. The resulting gate structure after the photoresist 66 is removed is illustrated in FIG. 13C. The interconnection portion 65 unprotected by the photoresist 66 is also etched and removed, thereby forming endcap 67 extending a distance "z" between about 40 nm and about 60 nm above active region 62, and forming gate gap 69 having a minimum width y between about 65 nm and about 95 nm. Thus, in one example, a distance "x" between a bottom edge of the horizontal gate structure 60d and a top edge of active region 62 of the substrate is between about 105 nm and about 155 nm, which is reduced from the conventional spacing requirement of 180 nm. By using this embodiment of the present invention, the minimum extension of endcaps and the minimum spacing between vertical and horizontal gate lines are controlled and optimized to reduce the area constraints conventionally required of vertical and horizontal gate lines, thus improving gate line density while also improving device performance and leakage uniformity control.

The dummy patterns and the interconnection portion may be removed by a dry etching, wet etching, or combination dry and wet etching process. For example, a wet etching process may include exposure to a hydroxide containing solution (e.g., ammonium hydroxide), de-ionized water, and/or other suitable etchant solutions. Etching the poly layer may be performed using HBr, $CF_4$, $Cl_2$, $O_2$ or $HeO_2$ at a temperature of about 0° C.-100° C. Furthermore, the dummy patterns and the interconnection portion may be removed in a single-step etching process or multiple-step etching process. It is understood that other etching chemicals may be used for selectively removing the dummy dielectric and dummy poly gate.

The remaining elements of the MOS device such as spacers, source/drain, etc, are then formed. The forming process has been discussed in previous embodiments and thus will not be repeated.

Figures 14A, 14B:
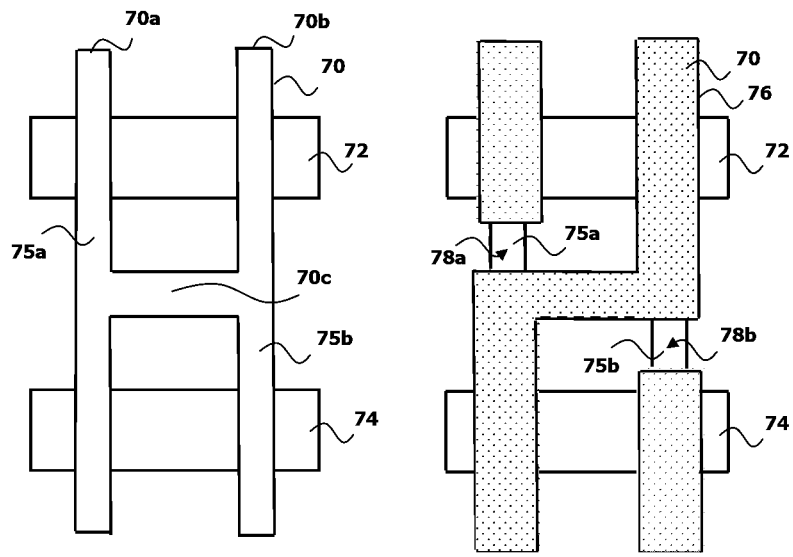
FIGS. 14A-14C illustrate top views of intermediate stages in the manufacture of another semiconductor structure.
Figure 14C:
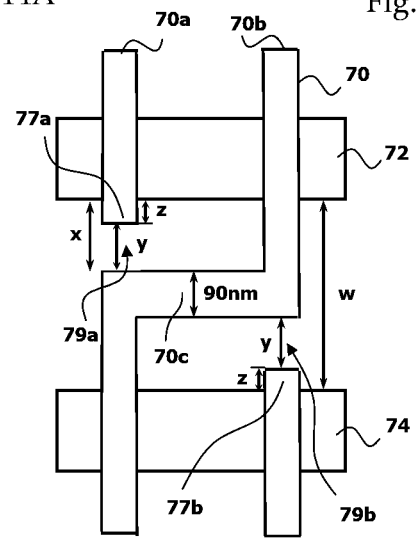

FIGS. 14A-14C illustrate top views of intermediate stages in the manufacture of another semiconductor structure having vertical and horizontal gate structures in a high density layout. Similar to the structure and techniques described above, FIG. 14A illustrates a top view of a gate structure 70 including vertical gate structures 70a and 70b and horizontal gate structure 70c. Portions of vertical gate structures 70a and 70b are formed over active regions 72 and 74. Horizontal gate structure 70c is formed over an insulating region between active regions 72 and 74. Dummy patterns (not shown) may also be formed in active and insulating regions. The dummy patterns may have uniform or non-uniform spacing and may be comprised of the same material as the gate structures. An example method for forming gate structure 70 and dummy patterns has been described above with reference to FIGS. 3 through 5 and will not be repeated in the present embodiment. However, various layer deposition, photolithography, and etch techniques may be used to form gate structure 70. As will be noticed, vertical gate structures 70a, 70b and horizontal gate structure 70c form several sections of an "H" shaped gate structure 70. It will be further noticed that vertical gate structures 70a, 70b and horizontal gate structure 70c can form several "T" shaped parts of the gate structure 70. For example, in this embodiment, vertical gate structures 70a and 70b with horizontal gate structure 70c each form a respective "T" shaped part of gate structure 70. In this embodiment, the horizontal gate structure 70c and vertical gate structure 70a are interconnected by an interconnection portion 75a, and the horizontal gate structure 70c and vertical gate structure 70b are interconnected by an interconnection portion 75b, which will be later etched as further described below. Although these interconnection portions 75a, 75b are described in this embodiment, gate structure 70 may be considered to have an interconnection portion at any section between a horizontal gate structure and a vertical gate structure which is desired to be etched.

FIG. 14B illustrates a photoresist 76 formed over gate structure 70 protecting the vertical and horizontal gate structures but exposing the interconnection portions 75a, 75b through a photoresist gap 78a, 7b in the photoresist 76. Similar to the previously discussed embodiment, photoresist 76 may extend beyond parts of gate structure 70 for between about 10 nm and about 150 nm so that parts of the gate structure are completely covered. Gaps 78a, 78b are formed in the photoresist 76 over the interconnection portions 75a, 75b. In one embodiment, gaps 78a, 78b each have a width "y" between about 65 nm and about 95 nm (as shown by gate gaps 79a, 79b in gate structure 70 in FIG. 14C), although the width of photoresist gaps 78a, 78b are a design consideration and can be changed according to the layout. In order to prevent over-etching through the photoresist gaps 78a, 78b in the subsequent process steps causing gate ends to recess back into active region 72, 74 photoresist 76 extends beyond active regions 72, 74 for a distance between about 40 nm and about 60 nm (as shown by endcaps 77a, 77b in FIG. 14C). The patterned photoresist 76 may be formed by photolithography, immersion lithography, ion-beam writing, or other suitable techniques. For example, the photolithography process may include spin-coating, soft-baking, exposure, post-baking, developing, rinsing, drying, and other suitable processes.

Dummy patterns are then etched and photoresist 76 is removed. The resulting gate structure after the photoresist 76 is removed is illustrated in FIG. 14C. The interconnection portions 75a, 75b unprotected by the photoresist 76 are also etched and removed, thereby forming endcaps 77a, 77b which each extend a minimum distance "z" between about 40 nm and about 60 nm above active regions 72, 74, respectively, and forming gate gaps 79a, 79b having a minimum width y between about 65 nm and about 95 nm. Thus, a distance x between a top edge of the horizontal gate structure 70c and a bottom edge of active region 72 of the substrate is between about 105 nm and about 155 nm, and a distance between a bottom edge of the horizontal gate structure 70c and a top edge of active region 74 of the substrate is between about 105 nm and about 155 nm, which is reduced from the conventional spacing requirement of 180 nm. Furthermore, a distance w between opposing edges of the first and second active regions 72, 74 is between about 300 nm and about 400 nm. By using this embodiment of the present invention, the minimum extension of endcaps and the minimum spacing between vertical and horizontal gate lines are controlled and optimized to reduce the area constraints conventionally required of vertical and horizontal gate lines, thus improving gate line density while also improving device performance and leakage uniformity control.

The dummy patterns and the interconnection portion may be removed by a dry etching, wet etching, or combination dry and wet etching process. For example, a wet etching process may include exposure to a hydroxide containing solution (e.g., ammonium hydroxide), de-ionized water, and/or other suitable etchant solutions. Etching the poly layer may be performed using HBr, $CF_4$, $Cl_2$, $O_2$ or $HeO_2$ at a temperature of about 0° C.-100° C. Furthermore, the dummy patterns and the interconnection portion may be removed in a single-step etching process or multiple-step etching process. It is understood that other etching chemicals may be used for selectively removing the dummy dielectric and dummy poly gate.

The remaining elements of the MOS device such as spacers, source/drain, etc, are then formed. The forming process has been discussed in previous embodiments and thus will not be repeated.

Figure 15:
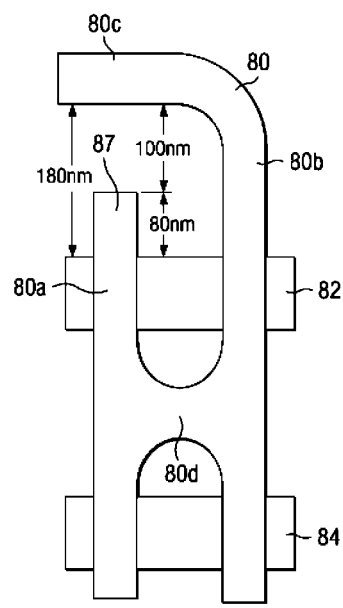
FIGS. 15 and 16 illustrate top views of a conventional semiconductor structure and a semiconductor structure having vertical and horizontal gate structures in accordance with aspects of the present disclosure, respectively.
Figure 16:
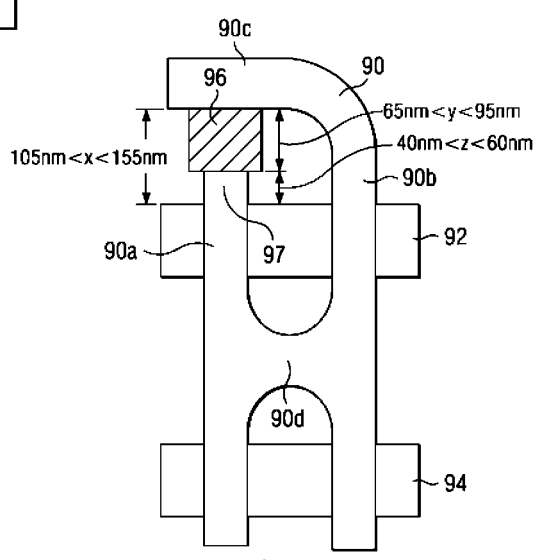

FIGS. 15 and 16 illustrate top views of a conventional semiconductor structure 80 and a semiconductor structure 90 having vertical and horizontal gate structures in a high density layout in accordance with aspects of the present disclosure, respectively. Conventional structure 80 includes vertical gate structures 80a and 80b and horizontal gate structures 80c and 80d. Portions of vertical gate structures 80a and 80b are formed over active regions 82 and 84. Horizontal gate structures 80c and 80d are formed over insulating regions. Vertical gate structure 80a includes an endcap 87 extending a minimum distance of about 80 nm above active region 82, and a gate gap between a tip of endcap 87 and horizontal gate structure 80c is a minimum distance of about 100 nm. Thus, a conventional spacing requirement between a bottom edge of the horizontal gate structure 80c and a top edge of active region 82 is about 180 nm.

In contrast, inventive structure 90 of FIG. 16 includes vertical gate structures 90a and 90b and horizontal gate structures 90c and 90d. Portions of vertical gate structures 90a and 90b are formed over active regions 92 and 94. Horizontal gate structures 90c and 90d are formed over insulating regions. Vertical gate structure 90a includes an endcap 97 extending a minimum distance between about 40 nm and about 60 nm above active region 92, and a gate gap between a tip of endcap 97 and horizontal gate structure 90c is a minimum distance between about 65 nm and about 95 nm, as shown by gate cut region 96. Thus, a greatly reduced spacing requirement of the present disclosure between a bottom edge of the horizontal gate structure 90c and a top edge of active region 92 is between about 105 nm and about 155 nm as compared to the conventional 180 nm.

Figure 17:
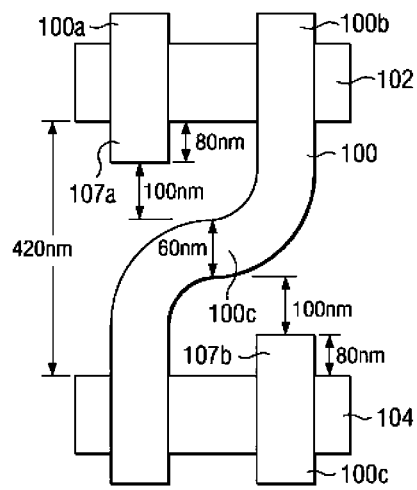
FIGS. 17 and 18 illustrate top views of another conventional semiconductor structure and another semiconductor structure having vertical and horizontal gate structures in accordance with aspects of the present disclosure, respectively.
Figure 18:
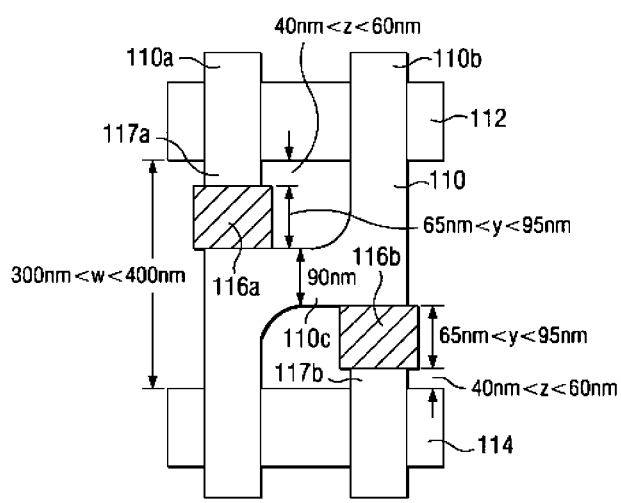

FIGS. 17 and 18 illustrate top views of another conventional semiconductor structure and another semiconductor structure having vertical and horizontal gate structures in accordance with aspects of the present disclosure, respectively. Conventional structure 100 includes vertical gate structures 100a, 100b, 100c, and a horizontal gate structure 100c. Portions of vertical gate structures 100a, 100b, 100c are formed over active regions 102 and 104. Horizontal gate structure 100c is formed over an insulating region between active regions 102 and 104. Vertical gate structures 100a and 100c each includes an endcap 107a and 107b, respectively, extending a minimum distance of about 80 nm beyond active regions 102 and 104, respectively. Gate gaps between a tip of endcaps 107a, 107b and an opposing edge of horizontal gate structure 100c is a minimum distance of about 100 nm. Thus, a conventional spacing requirement between an opposing edge of the horizontal gate structure 100c and an opposing edge of active region 102 or 104 is about 180 nm.

In contrast, inventive structure 110 of FIG. 18 includes vertical gate structures 110a and 110b and a horizontal gate structure 110c. Portions of vertical gate structures 110a and 110b are formed over active regions 112 and 114. Horizontal gate structure 110c is formed over an insulating region between active regions 112 and 114. Vertical gate structures 110a and 110b each includes an endcap 117a and 117b, respectively, extending a minimum distance between about 40 nm and about 60 nm beyond active region 112 and 114, respectively. A gate gap between a tip of endcap 117a or 117b and an opposing edge of horizontal gate structure 110c is a minimum distance between about 65 nm and about 95 nm, as shown by gate cut region 116a, 116b. Thus, a significantly reduced spacing requirement of the present disclosure between an opposing edge of the horizontal gate structure 110c and an opposing edge of active region 112 or 114 is between about 105 nm and 155 nm as compared to the conventional 180 nm. Furthermore, a distance between opposing edges of the first and second active regions 112 and 114 is between about 300 nm and about 400 nm, whereas the comparable distance between opposing edges of the first and second active regions 102 and 104 in the conventional structure is about 420 nm.

Thus, by using the embodiments of the present invention, the minimum extension of endcaps and the minimum spacing between vertical and horizontal gate lines are controlled and optimized to reduce the area constraints conventionally required of vertical and horizontal gate lines, thus improving gate line density while also improving device performance and leakage uniformity control.

Figure 19:
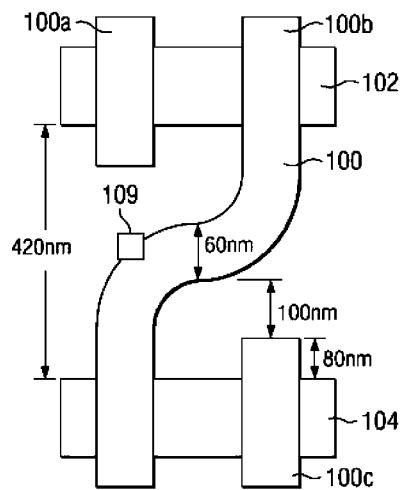
FIGS. 19 and 20 illustrate top views of a conventional semiconductor structure and a semiconductor structure including a contact in accordance with aspects of the present disclosure, respectively.
Figure 20:
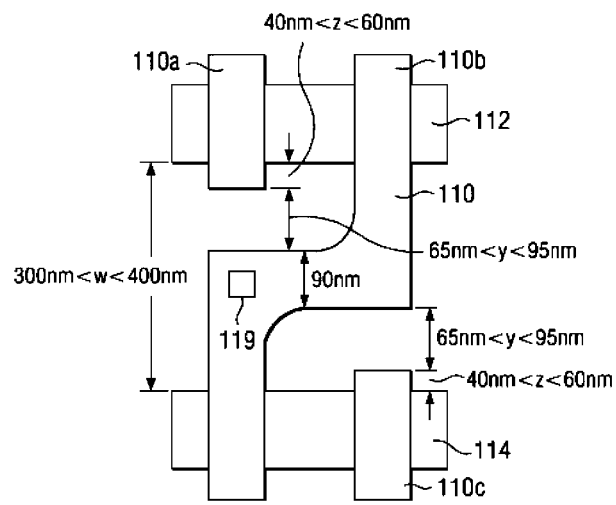

Furthermore, FIGS. 19 and 20 illustrate top views of the conventional semiconductor structure 100 and a semiconductor structure 110 in accordance with aspects of the present disclosure, respectively. As can be seen, a contact 109 on the conventional gate structure 110 may have high contact resistance or open contact issues when landing a contact on the structure 110. In contrast, the present disclosure provides a robust process for contact landing, as shown by a comparable contact 119 landed on innovative structure 110, which includes a larger horizontal gate structure than the conventional horizontal gate structure (i.e., 90 nm width versus 60 nm width of comparable horizontal gate structures).

Figure 21:
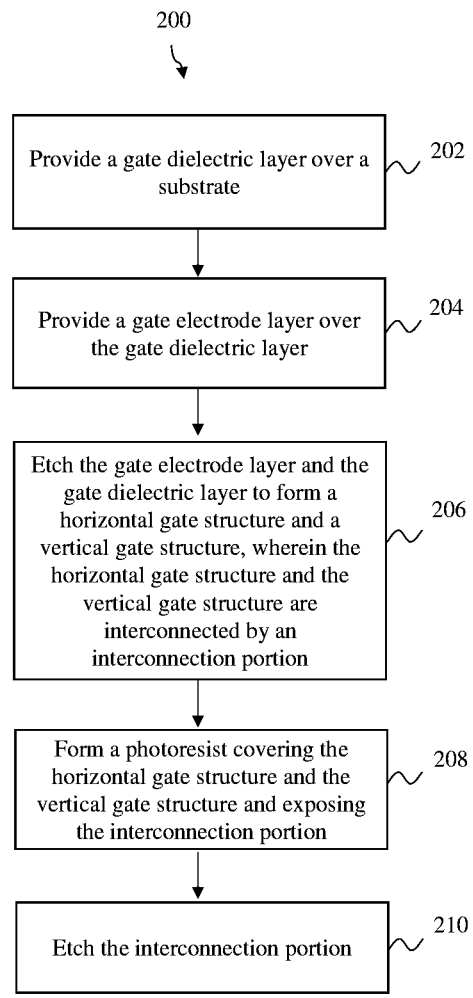
FIG. 21 is a flowchart illustrating a method of fabricating a semiconductor structure with a high density gate layout according to various aspects of the present disclosure.

Referring now to FIG. 21, a flowchart illustrates a method of fabricating a semiconductor structure with a high density gate layout according to various aspects of the present disclosure. The method 200 begins with block 202 in which a substrate and a gate dielectric layer over the substrate are provided. The method 200 continues with block 204 in which a gate electrode layer is provided over the gate dielectric layer. The gate electrode layer and the gate dielectric layer are then etched to form a horizontal gate structure and a vertical gate structure, as shown in block 206. The horizontal gate structure and the vertical gate structure are interconnected by an interconnection portion. The method continues with block 208 in which a photoresist is formed to cover the horizontal gate structure and the vertical gate structure and exposing the interconnection portion. Finally, the interconnection portion is etched through the photoresist, as shown in block 210.

It should be noted that the techniques and processes, such as photoresist formation and etching, as disclosed above with reference to FIGS. 3-12 can also be implemented in the various embodiments disclosed above with reference to FIGS. 13A-21. Conversely, it should be noted that the techniques and processes as disclosed above with reference to FIGS. 13A-21 can also be implemented in the various embodiments disclosed above with reference to FIGS. 3-12. It is also understood that the semiconductor device may undergo further processing to form various features such as contacts/vias, interconnect metal layers, interlayer dielectric, passivation layers, inductors, capacitors, etc. before or after the method outlined in FIG. 21.

The present disclosure provides for many different embodiments. One of the broader forms of the present disclosure involves a method of fabricating a semiconductor device. The method includes forming a gate dielectric layer over a substrate, forming a gate electrode layer over the gate dielectric layer, and etching the gate electrode layer and the gate dielectric layer to form a horizontal gate structure and a vertical gate structure, wherein the horizontal gate structure and the vertical gate structure are connected by an interconnection portion. The method further includes forming a photoresist covering the horizontal gate structure and the vertical gate structure, with the photoresist having a gap exposing the interconnection portion between the horizontal gate structure and the vertical gate structure, and then etching the interconnection portion.

Another of the broader forms of the present disclosure involves another method of fabricating a semiconductor device. The method includes providing a semiconductor substrate comprising: a first active region; a second active region; and an insulating region separating the first and the second active regions. The method further includes forming a vertical gate structure extending over the first and the second active regions and the insulating region, and forming a horizontal gate structure extending over the insulating region between the first and the second active regions, wherein the horizontal gate structure and the vertical gate structure are connected by an interconnection portion. A photoresist having a first portion and a second portion is then formed, wherein the first portion of the photoresist covers a portion of the vertical gate structure, and the second portion of the photoresist covers the horizontal gate structure, wherein the first and the second portions of the photoresist have a gap exposing the interconnection portion directly over the insulating region. The interconnection portion is then etched.

Another of the broader forms of the present disclosure involves a semiconductor structure. The semiconductor structure includes a substrate having a first active region, a second active region, and an insulating region separating the first and the second active regions. The structure further includes a vertical gate structure extending over the first and the second active regions and the insulating region, and a horizontal gate structure extending over the insulating region between the first and the second active regions, wherein the horizontal gate structure and the vertical gate structure have a gap of about 65 nm and about 95 nm therebetween directly over the insulating region.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming a semiconductor structure, the method comprising:
    forming spaced first and second active regions in a substrate, an insulating region separating the first and the second active regions;
    forming a gate dielectric layer over the substrate;
    forming a gate electrode layer over the gate dielectric layer;
    etching the gate electrode layer and the gate dielectric layer to form a horizontal gate structure extending over the insulating region between the first and the second active regions and to form spaced first and second vertical gate structures, wherein the horizontal gate structure and the first vertical gate structure are connected by an interconnection portion;
    forming a photoresist covering the horizontal gate structure and the first and second vertical gate structures, the photoresist having a gap exposing the interconnection portion between the horizontal gate structure and the first vertical gate structure;
    etching the interconnection portion;
    forming an anti-reflective coating (ARC) over the gate electrode layer before the horizontal gate structure and the first and second vertical gate structures are formed;
    removing the photoresist; and
    removing the ARC after the photoresist is removed.

2. The method of claim 1, wherein the horizontal gate structure, the interconnection portion, and the first vertical gate structure form a T shape or an L shape.

3. The method of claim 1, wherein the gap in the photoresist has a width between about 65 nm and about 95 nm.

4. The method of claim 1, wherein etching the interconnection portion forms an endcap on the first vertical gate structure, the endcap formed to extend between about 40 nm and about 60 nm from an edge of an active region of the substrate.

5. The method of claim 1, wherein a distance between an edge of the horizontal gate structure and an edge of an active region of the substrate is between about 105 nm and about 155 nm.

6. The method of claim 1, wherein etching the gate electrode layer and the gate dielectric layer forms dummy patterns in an active region of the substrate, the dummy patterns having non-uniform spacing and being comprised of the same material as the gate structure.

7. The method of claim 1,
    wherein the horizontal gate structure and the second vertical gate structure are connected by a further interconnection portion;
    wherein forming the photoresist includes forming the photoresist to have a further gap exposing the further interconnection portion between the horizontal gate structure and the second vertical gate structure; and
    wherein etching the interconnection portion includes etching the further interconnection portion.

8. The method of claim 1,
    wherein the etching the gate electrode layer and the gate dielectric layer includes forming a further horizontal gate structure spaced from the horizontal gate structure, wherein the further horizontal gate structure and the first vertical gate structure are connected by a further interconnection portion; and wherein forming the photoresist includes forming the photoresist to cover the further horizontal gate structure.

9. The method of claim 1,
wherein the etching the gate electrode layer and the gate dielectric layer includes forming a dummy pattern;
wherein forming the photoresist includes forming the photoresist to have a further gap exposing the dummy pattern; and
wherein etching the interconnection portion includes etching the dummy pattern.

10. The method of claim 1,
including, after the etching the interconnection portion, forming a contact on the horizontal gate structure in an area adjacent the interconnection portion, the area being large enough to fully contain the contact.

11. A method of forming a semiconductor structure, the method comprising:
forming a gate dielectric layer over a substrate;
forming a gate electrode layer over the gate dielectric layer;
etching the gate electrode layer and the gate dielectric layer to form a horizontal gate structure and a vertical gate structure, wherein the horizontal gate structure and the vertical gate structure are connected by an interconnection portion;
forming a photoresist covering the horizontal gate structure and the vertical gate structure, the photoresist having a gap exposing the interconnection portion between the horizontal gate structure and the vertical gate structure;
etching the interconnection portion;
forming an anti-reflective coating (ARC) over the gate electrode layer before the horizontal gate structure and the vertical gate structure are formed;
removing the photoresist; and
removing the ARC after the photoresist is removed;
wherein etching the gate electrode layer and the gate dielectric layer includes forming a dummy gate;
wherein forming the photoresist includes forming the photoresist to have a further gap exposing the dummy gate; and
wherein etching the interconnection portion includes etching the dummy gate.

12. A method of forming a semiconductor structure, the method comprising:
providing a semiconductor substrate comprising:
a first active region;
a second active region; and
an insulating region separating the first and the second active regions;
forming a vertical gate structure extending over the first and the second active regions and the insulating region;
forming a horizontal gate structure extending over the insulating region between the first and the second active regions, wherein the horizontal gate structure and the vertical gate structure are connected by an interconnection portion;
forming a photoresist having a first portion and a second portion, wherein the first portion of the photoresist covers a portion of the vertical gate structure, and the second portion of the photoresist covers the horizontal gate structure, wherein the first and the second portions of the photoresist have a gap exposing the interconnection portion directly over the insulating region; and
etching the interconnection portion exposed through the gap;
wherein the forming the vertical gate structure includes forming a dummy pattern;
wherein forming the photoresist includes forming the photoresist to have a further gap exposing the dummy pattern; and
wherein etching the interconnection portion includes etching the dummy pattern.

13. The method of claim 12, wherein the first and the second active regions are parallel, and wherein the vertical gate structure is a straight strip having a longitudinal direction perpendicular to a longitudinal direction of the first and the second active regions.

14. The method of claim 13, wherein a distance between opposing edges of the first and second active regions is between about 300 nm and about 400 nm.

15. The method of claim 12, wherein the horizontal gate structure, the interconnection portion, and the vertical gate structure form a T shape or an L shape.

16. The method of claim 12, wherein the gap in the photoresist has a width between about 65 nm and about 95 nm.

17. The method of claim 12, wherein etching the interconnection portion forms an endcap on the vertical gate structure, the endcap formed to extend between about 40 nm and about 60 nm from an edge of an active region of the substrate.

18. The method of claim 12, wherein a distance between an edge of the horizontal gate structure and an edge of an active region of the substrate is between about 105 nm and about 155 nm.

* * * * *